(12) United States Patent
Lee et al.

(10) Patent No.: US 9,888,567 B2
(45) Date of Patent: Feb. 6, 2018

(54) FLEXIBLE DEVICE INCLUDING SLIDING INTERCONNECTION STRUCTURE

(71) Applicant: SK hynix Inc., Icheon-si, Gyeonggi-do (KR)

(72) Inventors: Seung Yeop Lee, Suwon-si (KR); Joo Hyun Kang, Seoul (KR); Jong Hoon Kim, Suwon-si (KR); Han Jun Bae, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 85 days.

(21) Appl. No.: 14/989,921

(22) Filed: Jan. 7, 2016

(65) Prior Publication Data
US 2017/0064832 A1    Mar. 2, 2017

(30) Foreign Application Priority Data
Aug. 26, 2015 (KR) .................. 10-2015-0119964

(51) Int. Cl.
| | |
|---|---|
| H05K 1/11 | (2006.01) |
| H05K 1/02 | (2006.01) |
| H01L 23/538 | (2006.01) |
| H05K 1/00 | (2006.01) |
| H05K 1/18 | (2006.01) |

(Continued)

(52) U.S. Cl.
CPC .......... *H05K 1/028* (2013.01); *H01L 23/5383* (2013.01); *H01L 23/5384* (2013.01); *H01L 23/5386* (2013.01); *H01L 23/5387* (2013.01); *H01L 2224/48227* (2013.01); *H01L 2224/48228* (2013.01); *H01L 2224/97* (2013.01); *H01L 2924/15174* (2013.01); *H01L 2924/15184* (2013.01); *H01L 2924/15311* (2013.01); *H01L 2924/181* (2013.01); *H05K 1/14* (2013.01); *H05K 1/147* (2013.01);

(Continued)

(58) Field of Classification Search
CPC ............... H05K 2201/05; H05K 1/147; H05K 2201/058; H05K 1/14; H05K 1/142; H05K 3/4691; H05K 1/144; H05K 2201/042; H05K 1/117; H05K 2201/1034; H01R 12/72; H01R 23/6893; H01R 23/70
USPC ............... 361/748, 749, 760, 767, 784, 785, 361/789–792
See application file for complete search history.

(56) References Cited

U.S. PATENT DOCUMENTS

| | | | |
|---|---|---|---|
| 7,547,850 B2 * | 6/2009 | Kirby ................. | G01R 1/07357 174/260 |
| 2007/0000685 A1 * | 1/2007 | Inoue ..................... | H05K 1/117 174/255 |
| 2007/0178751 A1 * | 8/2007 | Yamamoto ............ | H01R 12/79 439/495 |

FOREIGN PATENT DOCUMENTS

| | | |
|---|---|---|
| KR | 1020110128227 A | 11/2011 |
| KR | 1020140143961 A | 12/2014 |

* cited by examiner

*Primary Examiner* — Binh Tran
(74) *Attorney, Agent, or Firm* — William Park & Associates Ltd.

(57) ABSTRACT

A flexible device includes a first conductive pattern, a second conductive pattern, and a dielectric layer. The first conductive pattern includes a first sliding contact portion and a first extension portion. The second conductive pattern includes a second sliding contact portion overlapping with the first sliding contact portion and the second conductive pattern includes a second extension portion. The second sliding contact portion is in contact with the first sliding (Continued)

contact portion and is movable on the first sliding contact portion for a sliding motion. The first and second conductive patterns are embedded in the dielectric layer.

14 Claims, 13 Drawing Sheets

(51) Int. Cl.
*H05K 7/00* (2006.01)
*H05K 1/14* (2006.01)

(52) U.S. Cl.
CPC . *H05K 2201/0385* (2013.01); *H05K 2201/05* (2013.01); *H05K 2201/058* (2013.01)

FLEXIBLE DEVICE INCLUDING SLIDING INTERCONNECTION STRUCTURE

CROSS-REFERENCE TO RELATED APPLICATION

The present application claims priority under 35 U.S.C. 119(a) to Korean Application No. 10-2015-0119964, filed on Aug. 26, 2015, in the Korean Intellectual Property Office, which is incorporated herein by reference in its entirety.

BACKGROUND

1. Technical Field

Various embodiments of the present disclosure relate to a packaging technology and, more particularly, to flexible devices including a sliding interconnection structure.

2. Related Art

With the development of smaller electronic systems such as mobile systems, semiconductor packages which are capable of processing a large amount of data are increasingly in demand. In response to such a demand, it may be necessary to increase an integration density of semiconductor devices used in the electronic systems. As the interest in the portable and wearable electronics increases, a flexible property, flexibility, of the electronic systems becomes more increasingly required. The flexibility of electronic components such as semiconductor packages constituting the electronic systems has been required.

The semiconductor substrate or the semiconductor chip including semiconductor devices may be fabricated to have a thickness appropriate for warpage. Also, a package substrate on which the semiconductor chip is mounted may be formed to a thickness appropriate for warpage. Meanwhile, interconnection structures may be disposed in the semiconductor substrate or the package substrate. Accordingly, a lot of effort has been focused on developing techniques for realizing flexible interconnection structures which are capable of electrically connecting the chips of the semiconductor devices to each other or electrically connecting the chips of the semiconductor devices to a package substrate even when the chip or substrate of the semiconductor devices is bent or warped.

SUMMARY

According to an embodiment, there is provided a flexible device. The flexible device includes a first conductive pattern, a second conductive pattern, and a dielectric layer. The first conductive pattern includes a first sliding contact portion and a first extension portion. The second conductive pattern includes a second sliding contact portion overlapping with the first sliding contact portion and the second conductive pattern includes a second extension portion. The second sliding contact portion is in contact with the first sliding contact portion and is movable on the first sliding contact portion for a sliding motion. The first and second conductive patterns are embedded in the dielectric layer.

According to another embodiment, there is provided a flexible device. The flexible device includes a dielectric layer, a first sliding interconnection structure, and a second sliding interconnection structure. The dielectric layer is disposed on a first surface of a substrate body. The first sliding interconnection structure includes a first conductive pattern and a second conductive pattern disposed between the dielectric layer and the substrate body. The first conductive pattern has a first sliding contact portion and a first extension portion, and the second conductive pattern has a second sliding contact portion overlapping with the first sliding contact portion and the second conductive pattern includes a second extension portion. The second sliding interconnection structure is disposed on a second surface of the substrate body opposite to the dielectric layer. The second sliding contact portion is in contact with the first sliding contact portion and is movable on the first sliding contact portion for a sliding motion.

According to another embodiment, there is provided a flexible device. The flexible device includes a package substrate and a semiconductor chip mounted on the package substrate. The package substrate includes a dielectric layer formed on a first surface of a substrate body, a first sliding interconnection structure disposed between the dielectric layer and the substrate body to have a first conductive pattern and a second conductive pattern, and a second sliding interconnection structure disposed on a second surface of the substrate body opposite to the dielectric layer. The semiconductor chip is electrically connected to the first sliding interconnection structure. The first conductive pattern has a first sliding contact portion and a first extension portion. The second conductive pattern has a second sliding contact portion overlapping with the first sliding contact portion and the second conductive pattern includes a second extension portion. The second sliding contact portion is in contact with the first sliding contact portion and is movable on the first sliding contact portion for a sliding motion.

According to another embodiment, there is provided a flexible device. The flexible device includes a first semiconductor device and a second semiconductor device disposed to be spaced apart from each other and a flexible connector connecting the first semiconductor device to the second semiconductor device. The flexible connector includes a first conductive pattern, a second conductive pattern, and a flexible dielectric layer. The first conductive pattern includes a first extension portion electrically connected to the first semiconductor device and a first sliding contact portion extending from the first extension portion. The second conductive pattern includes a second sliding contact portion overlapping with the first sliding contact portion and the second conductive pattern includes a second extension portion extending from the second sliding contact portion to be electrically connected to the second semiconductor device. The second sliding contact portion is in contact with the first sliding contact portion and is movable on the first sliding contact portion for a sliding motion. The first and the second conductive patterns are embedded in the flexible dielectric layer.

According to another embodiment, there is provided a memory card including a flexible device. The flexible device includes a first conductive pattern, a second conductive pattern, and a dielectric layer. The first conductive pattern includes a first sliding contact portion and a first extension portion. The second conductive pattern includes a second sliding contact portion overlapping with the first sliding contact portion and the second conductive pattern includes a second extension portion. The second sliding contact portion is in contact with the first sliding contact portion and is movable on the first sliding contact portion for a sliding motion. The first and second conductive patterns are embedded in the dielectric layer.

According to another embodiment, there is provided a memory card including a flexible device. The flexible device includes a dielectric layer, a first sliding interconnection structure, and a second sliding interconnection structure. The dielectric layer is disposed on a first surface of a substrate body. The first sliding interconnection structure includes a first conductive pattern and a second conductive pattern disposed between the dielectric layer and the substrate body. The first conductive pattern has a first sliding contact portion and a first extension portion, and the second conductive pattern has a second sliding contact portion overlapping with the first sliding contact portion and the second conductive pattern includes a second extension portion. The second sliding interconnection structure is disposed on a second surface of the substrate body opposite to the dielectric layer. The second sliding contact portion is in contact with the first sliding contact portion and is movable on the first sliding contact portion for a sliding motion.

According to another embodiment, there is provided a memory card including a flexible device. The flexible device includes a package substrate and a semiconductor chip mounted on the package substrate. The package substrate includes a dielectric layer formed on a first surface of a substrate body, a first sliding interconnection structure disposed between the dielectric layer and the substrate body to have a first conductive pattern and a second conductive pattern, and a second sliding interconnection structure disposed on a second surface of the substrate body opposite to the dielectric layer. The semiconductor chip is electrically connected to the first sliding interconnection structure. The first conductive pattern has a first sliding contact portion and a first extension portion. The second conductive pattern has a second sliding contact portion overlapping with the first sliding contact portion and the second conductive pattern includes a second extension portion. The second sliding contact portion is in contact with the first sliding contact portion and is movable on the first sliding contact portion for a sliding motion.

According to another embodiment, there is provided a memory card including a flexible device. The flexible device includes a first semiconductor device and a second semiconductor device disposed to be spaced apart from each other and a flexible connector connecting the first semiconductor device to the second semiconductor device. The flexible connector includes a first conductive pattern, a second conductive pattern, and a flexible dielectric layer. The first conductive pattern includes a first extension portion electrically connected to the first semiconductor device and a first sliding contact portion extending from the first extension portion. The second conductive pattern includes a second sliding contact portion overlapping with the first sliding contact portion and the second conductive pattern includes a second extension portion extending from the second sliding contact portion to be electrically connected to the second semiconductor device. The second sliding contact portion is in contact with the first sliding contact portion and is movable on the first sliding contact portion for a sliding motion. The first and the second conductive patterns are embedded in the flexible dielectric layer.

According to another embodiment, there is provided an electronic system including a flexible device. The flexible device includes a first conductive pattern, a second conductive pattern, and a dielectric layer. The first conductive pattern includes a first sliding contact portion and a first extension portion. The second conductive pattern includes a second sliding contact portion overlapping with the first sliding contact portion and the second conductive pattern includes a second extension portion. The second sliding contact portion is in contact with the first sliding contact portion and is movable on the first sliding contact portion for a sliding motion. The first and second conductive patterns are embedded in the dielectric layer.

According to another embodiment, there is provided an electronic system including a flexible device. The flexible device includes a dielectric layer, a first sliding interconnection structure, and a second sliding interconnection structure. The dielectric layer is disposed on a first surface of a substrate body. The first sliding interconnection structure includes a first conductive pattern and a second conductive pattern disposed between the dielectric layer and the substrate body. The first conductive pattern has a first sliding contact portion and a first extension portion, and the second conductive pattern has a second sliding contact portion overlapping with the first sliding contact portion and the second conductive pattern includes a second extension portion. The second sliding interconnection structure is disposed on a second surface of the substrate body opposite to the dielectric layer. The second sliding contact portion is in contact with the first sliding contact portion and is movable on the first sliding contact portion for a sliding motion.

According to another embodiment, there is provided an electronic system including a flexible device. The flexible device includes a package substrate and a semiconductor chip mounted on the package substrate. The package substrate includes a dielectric layer formed on a first surface of a substrate body, a first sliding interconnection structure disposed between the dielectric layer and the substrate body to have a first conductive pattern and a second conductive pattern, and a second sliding interconnection structure disposed on a second surface of the substrate body opposite to the dielectric layer. The semiconductor chip is electrically connected to the first sliding interconnection structure. The first conductive pattern has a first sliding contact portion and a first extension portion. The second conductive pattern has a second sliding contact portion overlapping with the first sliding contact portion and the second conductive pattern includes a second extension portion. The second sliding contact portion is in contact with the first sliding contact portion and is movable on the first sliding contact portion for a sliding motion.

According to another embodiment, there is provided an electronic system including a flexible device. The flexible device includes a first semiconductor device and a second semiconductor device disposed to be spaced apart from each other and a flexible connector connecting the first semiconductor device to the second semiconductor device. The flexible connector includes a first conductive pattern, a second conductive pattern, and a flexible dielectric layer. The first conductive pattern includes a first extension portion electrically connected to the first semiconductor device and a first sliding contact portion extending from the first extension portion. The second conductive pattern includes a second sliding contact portion overlapping with the first sliding contact portion and the second conductive pattern includes a second extension portion extending from the second sliding contact portion to be electrically connected to the second semiconductor device. The second sliding contact portion is in contact with the first sliding contact portion and is movable on the first sliding contact portion for a sliding motion. The first and the second conductive patterns are embedded in the flexible dielectric layer.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
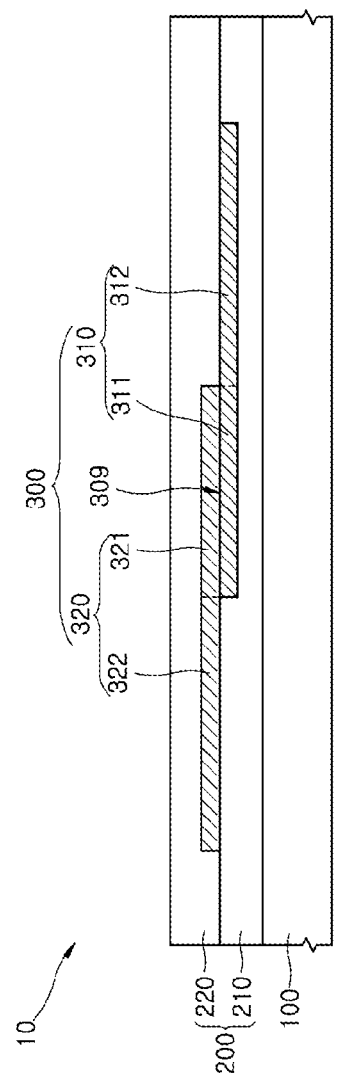
FIGS. 1 to 4 illustrate a flexible device including a sliding interconnection structure according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

A semiconductor package may include electronic devices such as semiconductor chips, and the semiconductor chips may be obtained by separating a semiconductor substrate such as a wafer into a plurality of pieces using a die sawing process. The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits which are integrated on and/or in the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
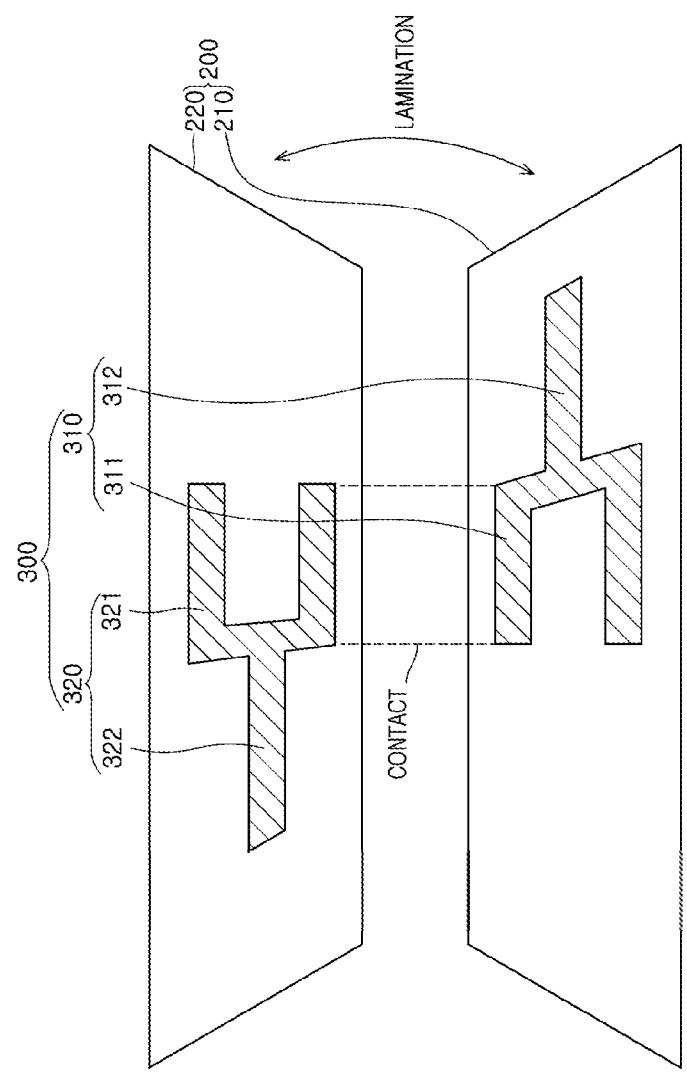
Figure 3:
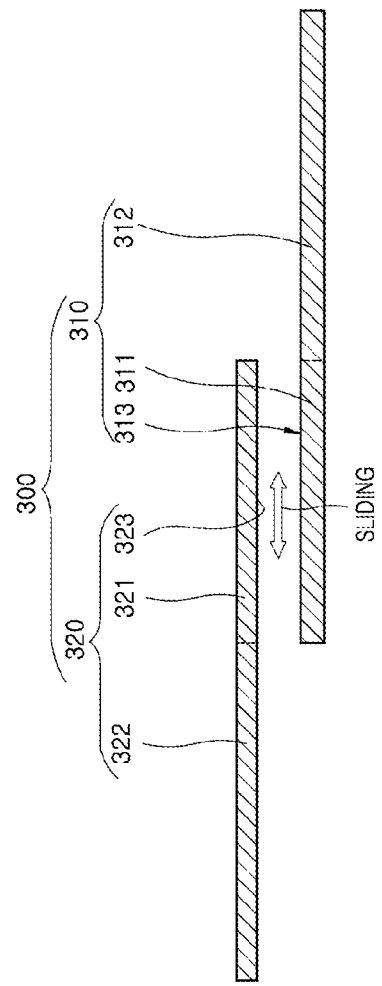
Figure 4:
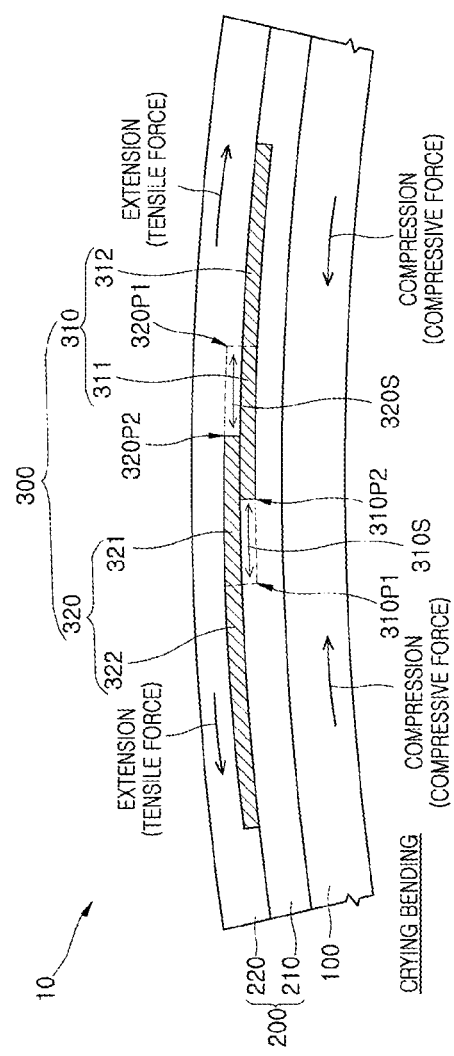

FIG. 1 is a cross-sectional view illustrating a flexible device 10 including a sliding interconnection structure 300 according to an embodiment. FIGS. 2 and 3 are a schematic view and a cross-sectional view illustrating members for realizing the sliding interconnection structure 300 of FIG. 1 using a lamination technique. FIG. 4 is a cross-sectional view illustrating the sliding interconnection structure 300 maintaining the electrical connection state when the flexible device 10 is bent.

Referring to FIG. 1, the flexible device 10 may include the sliding interconnection structure 300 embedded in and surrounded by a dielectric layer 200 disposed on a substrate 100. The dielectric layer 200 may be supported by the substrate 100. The substrate 100 may include a semiconductor substrate or a semiconductor chip on which integrated circuits are formed. The dielectric layer 200 and the sliding interconnection structure 300 may function as a portion of a multi-layered wiring structure disposed on a semiconductor substrate on which semiconductor devices such as transistors of an integrated circuit are formed. On the other hand, the substrate 100 may be a package substrate on which the semiconductor chips or the semiconductor devices are mounted. Accordingly, a body of the package substrate may support the dielectric layer 200. The package substrate may be a printed circuit board (PCB) or an embedded substrate which is capable of embedding the semiconductor devices therein. The dielectric layer 200 and the sliding interconnection structure 300 may correspond to parts of a circuit wiring structure disposed on the package substrate.

Referring to FIGS. 1 and 2, the sliding interconnection structure 300 may be embedded in the dielectric layer 200. The sliding interconnection structure 300 may include a first conductive pattern 310 and a second conductive pattern 320 that are separated from each other. The first conductive pattern 310 may include a first sliding contact portion 311 and a first extension portion 312 extending from the first sliding contact portion 311. The second conductive pattern 320 may also include a second sliding contact portion 321 and a second extension portion 322 extending from the second sliding contact portion 321. The first and second extension portions 312 and 322 may extend from the first and second sliding contact portions 311 and 321 respectively and may be electrically connected to other devices or other conductive lines. The first conductive pattern 310 and the second conductive pattern 320 may be electrically connected to each other to form one conductive line and, the conductive line may be used as a part of a circuit wire.

The first conductive pattern 310 and the second conductive pattern 320 may be disposed so that the second sliding contact portion 321 overlaps with the first sliding contact portion 311. A surface of the second sliding contact portion 321 and a surface of the first sliding contact portion 311 may be in contact with each other to provide a contact interface 309. A surface (323 of FIG. 3) of the second sliding contact portion 321 may be in direct contact with a surface (313 of FIG. 3) of the first sliding contact portion 311, but the surface 323 of the second sliding contact portion 321 is not fixed to the surface 313 of the first sliding contact portion 311. The first sliding contact portion 311 and the first extension portion 312 in one example, constitute the first conductive pattern 310. Thus, when speaking of the first sliding contact portion 311 as moving, the first extension portion 312 moves as well. This is also true of the second sliding contact portion 321 and the second extension portion 322. Accordingly, the first sliding contact portion 311 may slide on the second sliding contact portion 321, and the first and second conductive patterns 310 and 320 may be electrically connected to each other even while the first sliding contact portion 311 slides on the second sliding contact portion 321.

Since the first sliding contact portion 311 is not fixed to the surface of the second sliding contact portion 321, an external force may slide and move the first sliding contact portion 311 on the surface of the second sliding contact portion 321. Because the first sliding contact portion 311 and the second sliding contact portion 321 are in contact with each other and are movable on each other for a sliding motion in a horizontal direction, the first conductive pattern 310 may possibly not be fixed to the second conductive pattern 320 and positions of the first and second conductive patterns 310 and 320 may vary relative to each other.

Referring again to FIGS. 1 and 2, the first conductive pattern 310 and the second conductive pattern 320 may constitute one conductive line because the surface of the second sliding contact portion 321 is in contact with and is electrically connected to the surface of the first sliding contact portion 311. Although FIG. 1 illustrates an example in which one conductive line is segmented and divided into the first conductive pattern 310 and the second conductive pattern 320, the present disclosure is not limited thereto. For example, in some embodiments, the conductive line may be segmented and divided into three or more conductive patterns.

The sliding interconnection structure 300 including the first conductive pattern 310 and the second conductive pattern 320 contacting each other may be embedded into the dielectric layer 200. A first dielectric layer 210 may be located under the sliding interconnection structure 300 and a second dielectric layer 220 may be located on the sliding interconnection structure 300. The first and second dielectric layers 210 and 220 may constitute the dielectric layer 200. As illustrated in FIG. 2, the first conductive pattern 310 may be located on a surface of the first dielectric layer 210 and the second conductive pattern 320 may be located on a surface of the second dielectric layer 220. The first dielectric layer 210 and the second dielectric layer 220 may be in contact with each other using a lamination process to embed the sliding interconnection structure 300 into the dielectric layer 200.

The dielectric layer 200 may be formed by laminating the first dielectric layer 210 and the second dielectric layer 220, and the first conductive pattern 310 and the second conductive pattern 320 may be embedded in the dielectric layer 200 as illustrated in FIG. 1. More specifically, the first dielectric layer 210 and the second dielectric layer 220 may contact each other using a lamination process so that the first sliding contact portion 311 of the first conductive pattern 310 overlaps with the second sliding contact portion 321 of the second conductive pattern 320. The first dielectric layer 210 and the second dielectric layer 220 may wrap the first conductive pattern 310 and the second conductive pattern 320 to cause a force that presses the first sliding contact portion 311 down toward the second sliding contact portion 321.

Referring still to FIGS. 1 and 2, since the first sliding contact portion 311 and the second sliding contact portion 321 are in contact with each other to provide the electrical connection structure, a contact resistance value between the first and second conductive patterns 310 and 320 may be reduced by increasing a length of the first sliding contact portion 311 or the second sliding contact portion 321 so as to increase an area of the contact interface 309 between the first sliding contact portion 311 and the second sliding contact portion 321. The first sliding contact portion 311 may branch from the first extension portion 312 into two or more branches to provide a comb-shaped conductive pattern. Also, the second sliding contact portion 321 may branch from the second extension portion 322 into two or more branches to provide a comb-shaped conductive pattern. Accordingly, an effective contact length or an effective contact area between the first and second sliding contact portions 311 and 321 may be reduced. The first sliding contact portion 311 may be a pad pattern having a line width greater than that of the first extension portion 312 in order to increase a surface area of the first sliding contact portion 311. Similarly, the second sliding contact portion 321 may be a pad pattern having a line width which is greater than that of the second extension portion 322. Therefore, the effective contact area between the first sliding contact portion 311 and the second sliding contact portion 321 may increase which reduces the contact resistance between the first and second sliding contact portions 311 and 321. The first conductive pattern 310 and the second conductive pattern 320 may include a metal pattern including copper (Cu), aluminum (Al), or gold (Au).

Referring to FIG. 4, when the flexible device 10 is bent, a force that moves the first sliding contact portion 311 along a surface of the second sliding contact portion 321 may be applied to the sliding interconnection structure 300. When an external force is applied to the flexible device 10 to downwardly move both end portions of the flexible device 10, a crying bending may happen. The crying bending means that the both end portions of the flexible device 10 move downward with respect to a central portion of the flexible device 10 to show a crying shape. In such a case, a compressive force shrinking the substrate 100 may be generated, and a tensile force horizontally expanding the dielectric layer 200 and the sliding interconnection structure 300 may be generated.

The dielectric layer 200 including the first dielectric layer 210 and the second dielectric layer 220 may include a material which is capable of being elongated by the tensile force. The dielectric layer 200 including the first dielectric layer 210 and the second dielectric layer 220 may include an elastic material that is elongated by the tensile force and restored to its original shape when the tensile force is removed. In some embodiments, the dielectric layer 200 may include a polymer material such as polyimide or an elastic material such as silicone rubber or silicone resin. Accordingly, since the dielectric layer 200 can be elastically elongated or contracted by an external tensile force or an external compressive force, the dielectric layer 200 may have a flexible property. Also, since the substrate 100 can be elastically elongated or contracted by an external tensile force or an external compressive force, the substrate 100 may have a flexible property.

In the case of a smile bending where both end portions of the flexible device 10 move upward with respect to the central portion of the flexible device 10 to show a smile shape, the dielectric layer 200 may have a flexible property such that the dielectric layer 200 may be elastically contracted by the compressive force generated by an external force. The substrate 100 may also have a flexible property such that the substrate 100 may be elastically elongated by the tensile force generated by the external force.

When a tensile force is applied to the dielectric layer 200, the tensile force may also be applied to the sliding interconnection structure 300. The tensile force may act as a force that moves the first sliding contact portion 311 along the second sliding contact portion 321. The tensile force may shift the first sliding contact portion 311 from an initial position 310P1 to a position 310P2 by a predetermined distance 310S. Also, the tensile force may shift the second sliding contact portion 321 from an initial position 320P1 to a position 320P2 by a predetermined distance 320S. In this way, both of the first conductive pattern 310 and the second conductive pattern 320 may move relative to each other. The tensile force may act as a stress to the sliding interconnection structure 300, but the relative position of the first conductive pattern 310 with respect to the second conductive pattern 320 may be displaced to relieve the stress. Accordingly, the sliding interconnection structure 300 may maintain its electrical connection without damage or break even though an external force generates a tensile force on the sliding interconnection structure 300.

If the external force causing the crying bending is removed, the dielectric layer 200 may shrink to its original position due to the elastic elongation restoring force. At this time, the compressive force derived by the elastic restoration of the dielectric layer 200 may be applied to the sliding interconnection structure 300. The first sliding contact portion 311 may slide and move from the position 310P2 to the initial position 310P1 due to the compressive force. Also, the second sliding contact portion 321 may slide and move from the position 320P2 to the initial position 320P1 due to the compressive force. Thus, when the external force causing the crying bending disappears, the sliding interconnection structure 300 can be restored to its original form. The movement of the sliding interconnection structure 300 due to the external force may similarly occur in the smile bending which is opposite to the crying bending.

The first conductive pattern 310 and the second conductive pattern 320 constituting the sliding interconnection structure 300 may contain a metal material, but they do not contain any elastic material in itself. Nevertheless, the first conductive pattern 310 and the second conductive pattern 320 are separated from each other, and the first sliding contact portion 311 of the first conductive pattern 310 can slide or move with respect to the second sliding contact portion 321 of the second conductive pattern 320. Accordingly, it is possible for the first conductive pattern 310 and the second conductive pattern 320 to be displaced and to be restored to their original position by the external force. In other words, it is possible that the sliding interconnection structure 300 can be lengthened and restored to its original length. This is true well as for the elastic elongation, elastic shrinkage or elastic restoration of the sliding interconnection structure 300.

Referring again to FIG. 1, the flexible device 10 may include the sliding interconnection structure 300 disposed on the substrate 100. The substrate 100 may be a semiconductor substrate body such as a silicon layer on which integrated circuits are formed. The flexible device 10 may be a semiconductor chip or a semiconductor device having a multi-layered interconnection structure in which the sliding interconnection structure 300 and the dielectric layer 200 are provided. The flexible device 10 may have a structure having the sliding interconnection 300 disposed in the insulating substrate 100 including resin or fabric composites, and the substrate 100 may be a body of a package substrate such as printed circuit board (PCB). The flexible device 10 may be a package substrate where the sliding interconnection structure 300 and the dielectric layer 200 are provided as a circuit wiring structure. The flexible device 10 may have a structure including the sliding interconnection structure 300 and the dielectric layer 200 covering the sliding interconnection structure 300, and the flexible device 10 may act as an electrical connector electrically connecting two separate devices to each other.

Figure 5:
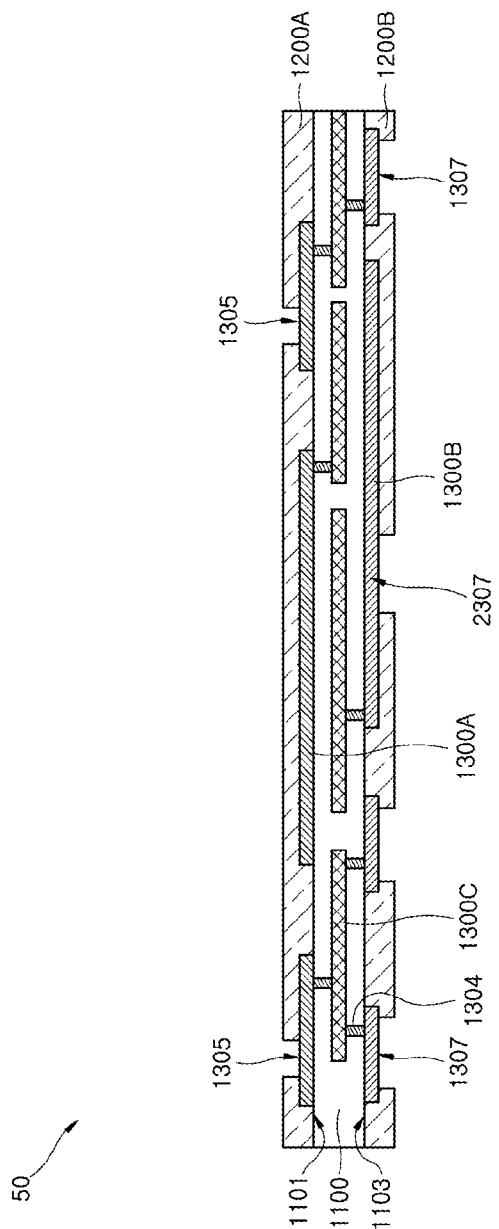
FIGS. 5 to 7 are cross-sectional views illustrating a flexible device including a sliding interconnection structure according to another embodiment.
Figure 6:
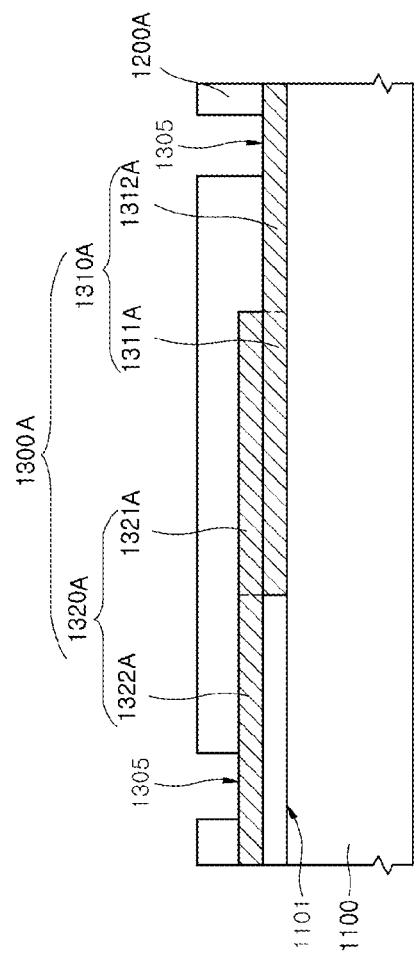
Figure 7:
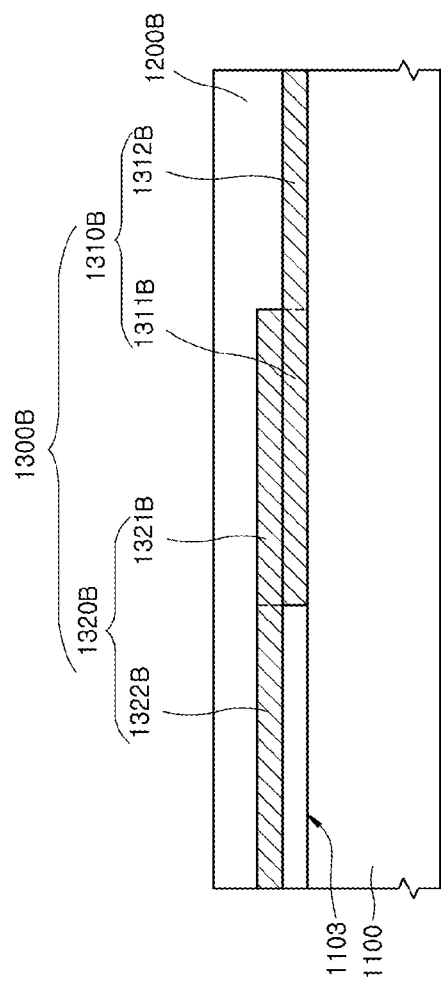

FIG. 5 is a cross-sectional view illustrating a flexible device 50 including first and second sliding interconnection structures 1300A and 1300B according to an embodiment. FIG. 6 is a cross-sectional view illustrating the first sliding interconnection structure 1300A, and FIG. 7 is a cross-sectional view illustrating the second sliding interconnection structure 1300B.

Referring to FIG. 5, the flexible device 50 may include a package substrate having the first sliding interconnection structure 1300A disposed on a first surface 1101 of a substrate body 1100 comprising a dielectric material, and the second sliding interconnection structure 1300B disposed on a second surface 1103 of the substrate body 1100 opposite to the first surface 1101. The package substrate may be a PCB or an embedded substrate in which a semiconductor device is embedded. The first sliding interconnection structure 1300A and the second sliding interconnection structure 1300B may be provided as conductive patterns constituting the circuit wiring structure of the package substrate.

The substrate body 1100 may include insulating resin such as epoxy resin or an insulating composite in which resin is impregnated in the fabric. The substrate body 1100 may include an insulating elastic material that functions as a core layer of the package substrate. An embedded wire 1300C may be embedded in the substrate body 1100. The first sliding interconnection structure 1300A, the second sliding interconnection structure 1300B and the third embedded wire 1300C may constitute a multi-layered wiring structure. Inner connecting wires 1304 for electrically connecting the first sliding interconnection structure 1300A to the embedded wire 1300C, electrically connecting the second sliding interconnection structure 1300B to the embedded wire 1300C, or electrically connecting the first sliding interconnection structure 1300A to the second sliding interconnection structure 1300B may be provided in substrate body 1100 to partially or fully penetrate the substrate body 1100.

Referring to FIGS. 5 and 6, the first sliding interconnection structure 1300A may include a first conductive pattern 1310A and a second conductive pattern 1320A which are separated from each other, like the sliding interconnection structure 300 illustrated in FIG. 1. The first conductive pattern 1310A may include a first sliding contact portion 1311A and a first extension portion 1312A extending from the first sliding contact portion 1311A. The second conductive pattern 1320A may include a second sliding contact portion 1321A and a second extension portion 1322A extending from the second sliding contact portion 1321A. The extension portions 1312A and 1322A may extend from the sliding contact portions 1311A and 1321A. A portion of each of the extension portions 1312A and 1322A may function as a first outer connecting portion 1305 that are connected to the inner connecting wire 1304 or to another device. The first conductive pattern 1310A and the second conductive pattern 1320A may be electrically connected to each other to provide one conductive line pattern. The conductive line pattern may be used as a part of a wiring circuit.

The first conductive pattern 1310A and the second conductive pattern 1320A may be disposed so that the second sliding contact portion 1321A overlaps with the first sliding contact portion 1311A. A surface of the second sliding contact portion 1321A contacts a surface of the first sliding contact portion 1311A, but the surface of the second sliding contact portion 1321A is not fixed to the surface of the first sliding contact portion 1311A. The first sliding contact portion 1311A and the first extension portion 1312A in one example, comprise the first conductive pattern 1310A. Thus, when speaking of the first sliding contact portion 1311A moving, the first extension portion 1312A moves as well. This is also true of the second sliding contact portion 1321A and the second extension portion 1322A. Accordingly, the first sliding contact portion 1311A and the second sliding contact portion 1321A may independently move or slide maintaining their electrical connection.

Since the first sliding contact portion 1311A and the second sliding contact portion 1321A merely contact each other to maintain their electrical connection, the first sliding contact portion 1311A and the second sliding contact portion 1322A may slide as described with reference to FIG. 3. A first dielectric layer 1200A may be located over the first sliding interconnection structure 1300A and the substrate body 1100 may be located below the first sliding interconnection structure 1300A. That is, the first sliding interconnection structure 1300A may be located in a dielectric layer comprised of the substrate body 1100 and the first dielectric layer 1200A. Since the first dielectric layer 1200A and the substrate body 1100 surround the first conductive pattern 1310A and the second conductive pattern 1320A, a force pressing the first sliding contact portion 1311A toward the second sliding contact portion 1321A may be generated by the first dielectric layer 1200A and the substrate body 1100. The substrate body 1100 may act as the first dielectric layer 210 of FIG. 1, and the first dielectric layer 1200A of FIG. 6 may act as the second dielectric layer 220 of FIG. 1. The first dielectric layer 1200A may be patterned to leave exposed portions of the extension portions 1312A and 1322A, and the exposed portions of the extension portions 1312A and 1322A may correspond to the first outer connecting portions 1305 electrically connecting the extension portions 1312A and 1322A to other devices.

Since the first sliding contact portion 1311A contacts the second sliding contact portion 1321A to provide an electrical connection between the first and second conductive patterns 1310A and 1320A, a contact resistance value between the first sliding contact portion 1311A and the second sliding contact portion 1321A may be reduced by increasing a length of the first sliding contact portion 1311A or the second sliding contact portion 1321A to increase a contact area between the first sliding contact portion 1311A and the second sliding contact portion 1321A. As described with reference to FIG. 2, the first sliding contact portion 1311A may branch from the first extension portion 1312A into two or more branches to provide a comb-shaped conductive pattern, and the second sliding contact portion 1321A may branch from the second extension portion 1322A into two or more branches to provide a comb-shaped conductive pattern. Accordingly, the contact resistance value between the first and second sliding contact portions 1311A and 1321A may be reduced by increasing the effective contact length or the effective contact area of the first sliding contact portion 1311A and the second sliding contact portion 1321A.

Referring to FIGS. 5 and 7, the second sliding interconnection structure 1300B may include a third conductive pattern 1310B and a fourth conductive pattern 1320B which are separated from each other like the sliding interconnection structure 300 structure shown in FIG. 1. FIG. 7 is a view of the third conductive pattern 1310B flipped over from the view presented in FIG. 5. so that the third conductive pattern 1310B is on top of the substrate body 1100. The third conductive pattern 1310B may include a third sliding contact portion 1311B and a third extension portion 1312B extending from the third sliding contact portion 1311B. The fourth conductive pattern 1320B may include a fourth sliding contact portion 1321B which overlaps with the third sliding contact portion 1311B. The fourth conductive pattern 1320B also includes a fourth extension portion 1322B extending from the fourth sliding contact portion 1321B. The extension portions 1312B and 1322B may extend from the sliding contact portions 1311B and 1321B. Portions of each of the extension portions 1312B and 1322B may function as second outer connecting portions 1307 that are connected to the inner connecting wires 1304 or other devices. The third conductive pattern 1310B and the fourth conductive pattern 1320B may be electrically connected to each other to provide one conductive line pattern. The conductive line pattern may be used as a part of a wiring circuit.

Since the third sliding contact portion 1311B and the fourth sliding contact portion 1321B contact each other to maintain their electrical connection, the third sliding contact portion 1311B and the fourth sliding contact portion 1321B may slide as described above with reference to FIG. 3. A second dielectric layer 1200B may be located over the second sliding interconnection structure 1300B, and the substrate body 1100 may be located below the second sliding interconnection structure 1300B. Thus, the second sliding interconnection structure 1300B may be located in a dielectric layer comprised of the substrate body 1100 and the second dielectric layer 1200B. Since the second dielectric layer 1200B and the substrate body 1100 surround the third conductive pattern 1310B and the fourth conductive pattern 1320B, a force pressing the third sliding contact portion 1311B toward the fourth sliding contact portion 1321B may be generated by the second dielectric layer 1200B and the substrate body 1100. The substrate body 1100 may act as the first dielectric layer 210 of FIG. 1, and the second dielectric layer 1200B of FIG. 6 may act as the second dielectric layer 220 of FIG. 1. The second dielectric layer 1200B may be patterned to leave exposed portions of the extension portions 1312B and 1322B, and the exposed portions of the extension portions 1312B and 1322B may function as second outer connecting portions 1307 electrically connecting the extension portions 1312B and 1322B to other devices.

Since the third sliding contact portion 1311B contacts the fourth sliding contact portion 1321B to provide an electrical connection between the third conductive pattern 1310B and the fourth conductive pattern 1320B, a contact resistance value may be reduced by increasing a length of the third sliding contact portion 1311B or the fourth sliding contact portion 1321B to increase a contact area between the third sliding contact portion 1311B and the fourth sliding contact portion 1321B. As described with reference to FIG. 2, the third sliding contact portion 1311B may branch from the third extension portion 1312B into two or more branches to provide a comb-shaped conductive pattern, and the fourth sliding contact portion 1321B may branch from the fourth extension portion 1322B into two or more branches to provide a comb-shaped conductive pattern. Accordingly, the contact resistance between the third and fourth sliding contact portions 1311B and 1321B may be reduced by increasing an effective contact length or an effective contact area of the third sliding contact portion 1311B and the fourth sliding contact portion 1321B.

As previously described with reference to FIG. 4, the first sliding interconnection structure 1300A or the second sliding interconnection structure 1300B may slide so that a tensile force or compressive force moves the first or third sliding contact portion 1311A or 1311B from an initial position by a predetermined distance if the flexible device 50 warps or bends. In addition, the first sliding interconnection structure 1300A or the second sliding interconnection structure 1300B may slide so that the second or fourth sliding contact portion 1321A or 1321B moves a predetermined distance from an initial position due to a tensile force or a compressive force. Thus, the first or the third conductive pattern 1310A or 1310B may move relative to the second or fourth conductive pattern 1320A or 1320B, and the stress due to the tensile force or the compressive force may be relieved. The embedded wires 1300C may be located at a mid-level of the flexible device 50. That is, the embedded wires 1300C may be disposed in a neutral plane where the tensile force generated on (or under) the embedded wires 1300C is offset by the compressive force generated under (or on) the embedded wires 1300C. Thus, the embedded wires 1300C may possibly not be damaged or broken even though the flexible device 50 warps or bends. Although the first sliding interconnection structure 1300A or the second sliding interconnection structure 1300B is located on the first surface 1101 or the second surface 1103 of the substrate body 1100 spaced apart from the neutral plane, the first sliding interconnection structure 1300A or the second sliding interconnection structure 1300B may possibly not be damaged or broken because the first or third conductive pattern 1310A or 1310B slides and moves to relieve a stress applied thereto when the flexible device 50 warps or bends.

Figure 8:
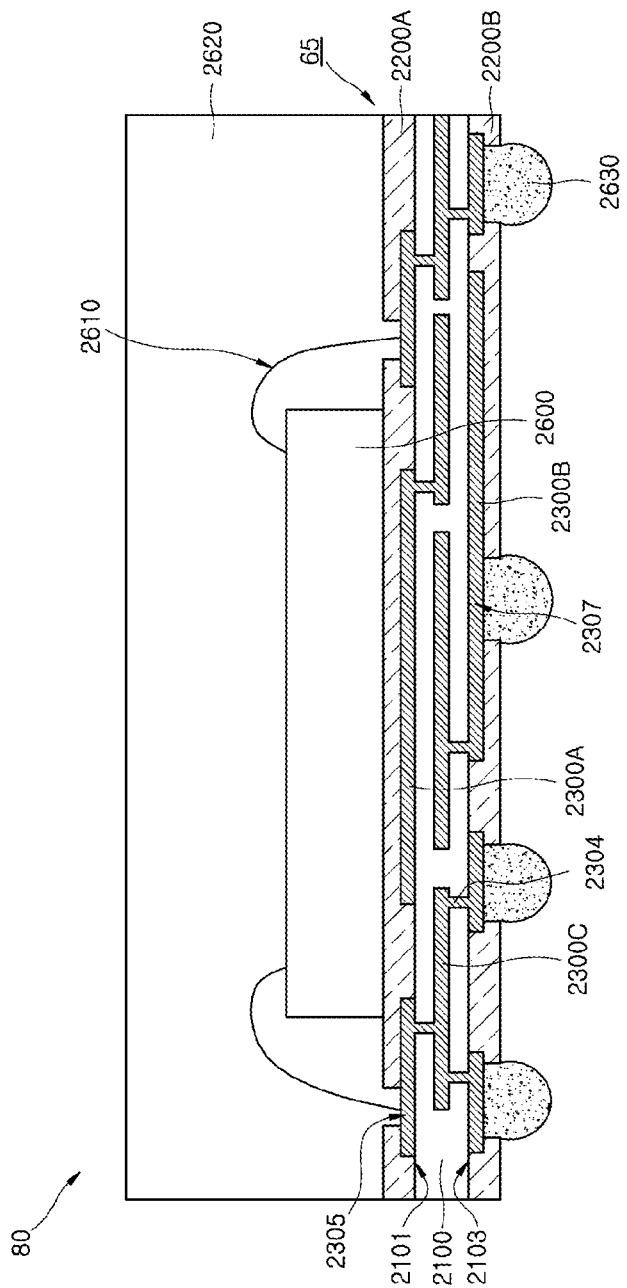
FIG. 8 is a cross-sectional view illustrating a flexible device including a sliding interconnection structure according to yet another embodiment.

FIG. 8 is a cross-sectional view illustrating a flexible device 80 including first and second sliding interconnection structures 2300A and 2300B according to an embodiment.

Referring to FIG. 8, the flexible device 80 may have a semiconductor package form including a semiconductor chip 2600 mounted on a package substrate 65 and electrically connected to a first sliding interconnection structure 2300A. The package substrate 65 may include a substrate body 2100 comprised of a dielectric layer, the first sliding interconnection structure 2300A formed on a first surface 2101 of the substrate body 2100, and a second sliding interconnection structure 2300B disposed on a second surface 2103 of the substrate body 2100 opposite the dielectric layer (e.g., 2200A or 2200B), as described with reference to FIGS. 5 to 7. The first sliding interconnection structure 2300A and second sliding interconnection structure 2300B may correspond to conductive patterns constituting a circuit wiring structure of the package substrate 65.

Embedded wires 2300C may be embedded in the substrate body 2100. The first sliding interconnection structure 2300A, the second sliding interconnection structure 2300B and the embedded wires 2300C may constitute a multi-layered wiring structure. Inner connecting wires 2304 may be disposed in the substrate body 2100 to partially or fully penetrate the substrate body 2100. The inner connecting wires 2304 may be for electrically connecting the first sliding interconnection structure 2300A to the embedded wire 2300C, connecting the second sliding interconnection structure 2300B to the embedded wire 2300C, or connecting the first sliding interconnection structure 2300A to the second sliding interconnection structure 2300B.

A first dielectric layer 2200A may be located over the first sliding interconnection structure 2300A, and the substrate body 2100 may be located below the first sliding interconnection structure 2300A. Accordingly, the first sliding interconnection structure 2300A may be disposed between the dielectric layer including the substrate body 2100 and the first dielectric layer 2200A. The substrate body 2100 may act as the first dielectric layer 210 of FIG. 1, and the first dielectric layer 2200A of FIG. 8 acts the second dielectric layer 220 of FIG. 1. The first dielectric layer 2200A may be patterned to leave exposed portions of the first sliding interconnection structures 2300A, and the exposed portions of the first sliding interconnection structures 2300A may act as first outer connecting portions 2305 to which bonding wires 2610 are bonded. The bonding wires 2610 may electrically connect the semiconductor device 2600 to the package substrate 65. Although it is illustrated that the bonding wires 2610 are connected to the first outer connecting portions 2305, bumps (not illustrated) instead of the bonding wires 2610 may be disposed on the first outer connecting portions 2305 and the semiconductor chip 2600 may be electrically connected to the first outer connecting portions 2305 through the bumps. A protection layer 2620 may be disposed to cover and protect the semiconductor chip 2600, and the protection layer 2620 may include a molding layer. The molding layer may include a polymer material such as polyimide, a silicone rubber containing silicone, or a silicone resin material.

A portion of the second sliding interconnection structure 2300B may correspond to a second outer connecting portion 2307 which is connected to the inner connecting wire 2304 or other devices. A second dielectric layer 2200B may be located on the second sliding interconnection structure 2300B, and the substrate body 2100 may be located below the second sliding interconnection structure 2300A. The second dielectric layer 2200B may be patterned to leave exposed the second outer connecting portion 2307. The substrate body 2100 may act as the first dielectric layer 210 of FIG. 1 and the second dielectric layer 2200B of FIG. 8 acts as the second dielectric layer 220 of FIG. 1. An outer connecting member 2630, for example, a solder ball may be attached to the second outer connecting portion 2307. Thus, the flexible device 80 may have a semiconductor package form, as mentioned above.

Figure 9:
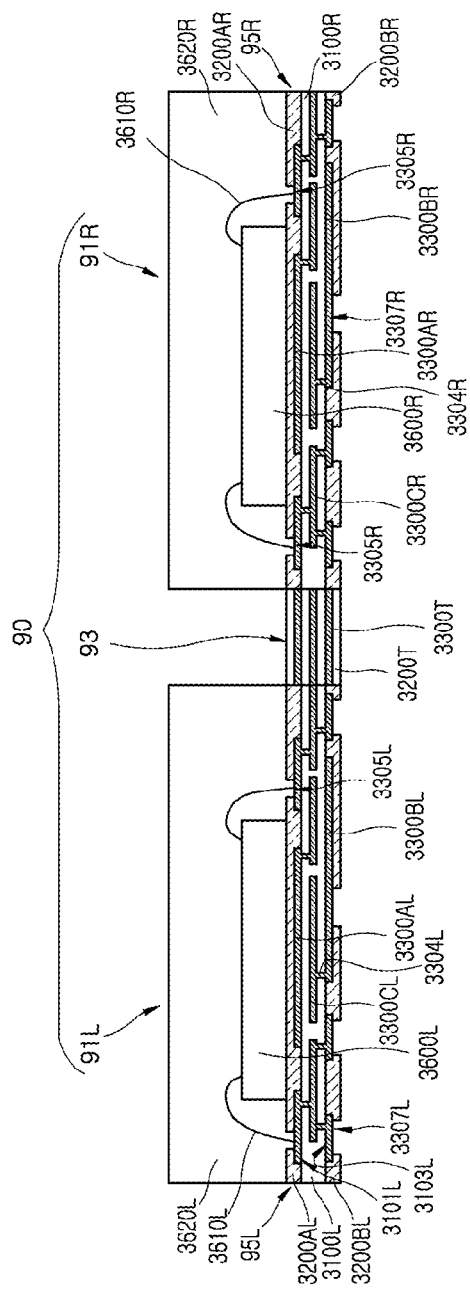
FIGS. 9 and 10 are cross-sectional views illustrating a flexible device including a sliding interconnection structure according to still another embodiment.
Figure 10:
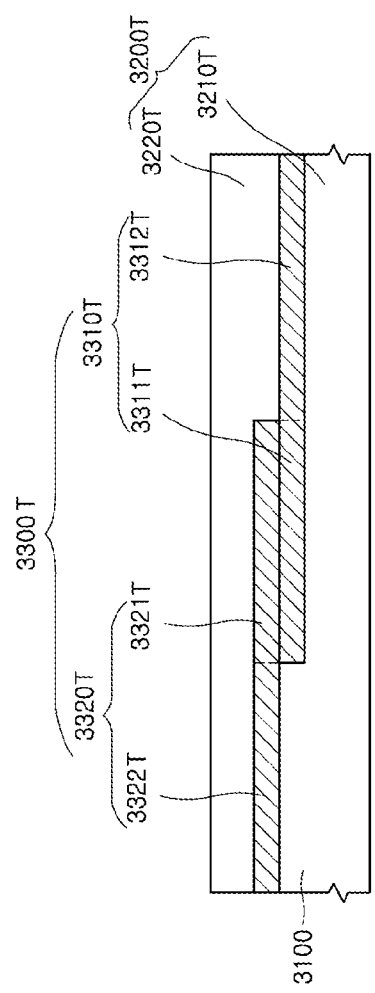

FIG. 9 is a cross-sectional view illustrating a flexible device 90 including first sliding interconnection structures 3300T according to an embodiment, and FIG. 10 is a cross-sectional view illustrating one of the first sliding interconnection structures 3300T shown in FIG. 9.

Referring to FIG. 9, the flexible device 90 may include a flexible connector 93 electrically connecting a first semiconductor device 91L to a second semiconductor device 91R. In one embodiment, the first semiconductor device 91L is disposed to be spaced apart from the second semiconductor device 91R. The flexible connector 93 may comprise the first sliding interconnection structures 3300T. The first sliding interconnection structures 3300T may be provided to electrically connect the first semiconductor device 91L to the second semiconductor device 91R. The first sliding interconnection structures 3300T may have a multi-layered wiring structure.

Referring to FIGS. 9 and 10, the flexible connector 93 may include a first dielectric layer 3200T in which the first sliding interconnection structures 3300T are embedded. The first dielectric layer 3200T may comprise an elastic material to have a flexible property. The first dielectric layer 3200T may comprise a polymer material such as polyimide, a silicone rubber material containing silicone, or a silicone resin material. Each of the first sliding interconnection structures 3300T may include a first conductive pattern 3310T and a second conductive pattern 3320T that are separated from each other, like the sliding interconnection structure 300 described with reference to FIG. 1. The first conductive pattern 3310T may include a first sliding contact portion 3311T and a first extension portion 3312T, which may be electrically connected to a semiconductor device (e.g., first semiconductor device 91L), extending from the first sliding contact portion 3311T. The second conductive pattern 3320T may include a second sliding contact portion 3321T and a second extension portion 3322T extending from the second sliding contact portion 3321T. The extension portions 3312T and 3322T may extend from the sliding contact portions 3311T and 3321T, and portions of the extension portions 3312T and 3322T may be electrically connected to the first semiconductor device 91L or the second semiconductor device 91R. The first conductive pattern 3310T and the second conductive pattern 3320T may be electrically connected to each other to provide one conductive line pattern. The conductive line pattern may be used as a part of a wiring circuit.

The first conductive pattern 3310T and the second conductive pattern 3320T may be disposed so that the second sliding contact portion 3321T overlaps with the first sliding contact portion 3311T. Although a surface of the second sliding contact portion 3321T contacts a surface of the first sliding contact portion 3311T, the surface of the second sliding contact portion is not fixed to the surface of the first sliding contact portion 3311T. Accordingly, the first sliding contact portion 3311T and the second sliding contact portion 3321T may merely contact each other to maintain an electrical connection.

Since the first sliding contact portion 3311T and the second sliding contact portion 3321T merely contact each other to maintain an electrical connection, the first sliding contact portion 3311T may be movable on the second sliding contact portion 3321T and may slide to move as described with reference to FIG. 3. A first sub-layer 3210T of the first dielectric layer 3200T may be located on the first sliding interconnection structures 3300T, and a second sub-layer 3210T of the first dielectric layer 3200T may be located below the first sliding interconnection structures 3300T. Thus, the first and second sub-layers 3210T and 3220T of the first dielectric layer 3200T may surround the first conductive pattern 3310T and the second conductive pattern 3320T of the first sliding interconnection structure 3300T. Accordingly, a force pressing on the first sliding contact portion 3311T toward the second sliding contact portion 3321T may be generated by the first dielectric layer 3200T. The first sub-layer 3210T of the first dielectric layer 3200T may act as the first dielectric layer 210 of FIG. 1 and the second sub-layer 3220T of the first dielectric layer 3200T may act as the second dielectric layer 220 of FIG. 1.

Since the first sliding contact portion 3311T of the first conductive pattern 3310T contacts the second sliding contact portion 3321T of the second conductive pattern 3320T to provide an electrical connection structure, a contact resistance value between the first and second sliding contact portions 3311T and 3321T may be reduced by increasing the length of the first sliding contact portion 3311T or the second sliding contact portion 3321T so as to increase a contact area between the first sliding contact portion 3311T and the second sliding contact portion 3321T. As described with reference to FIG. 2, the first sliding contact portion 3311T may branch from the first extension portion 3312T into two or more branches to have a comb-shaped conductive pattern, and the second sliding contact portion 3312T may branch from the second extension portion 3312T into two or more branches to have a comb-shaped conductive pattern. In such a case, an effective contact length or an effective contact area between the first sliding contact portion 3311T and the second sliding contact portion 3321T may increase to reduce the contact resistance between the first and second sliding contact portion 3311T and 3321T. The flexible connector 93 may have a multi-layered package substrate form including the first sliding interconnection structures 3300T embedded in the first dielectric layer 3200T.

Referring again to FIG. 9, the flexible device 90 may include the first semiconductor device 91L and the second semiconductor device 91R connected to each other by the flexible connector 93. At least one of the first semiconductor device 91L and the second semiconductor device 91R of the flexible device 90 may have a semiconductor package form.

The first semiconductor device 91L may be a first sub-package portion corresponding to a part of the semiconductor package. The first semiconductor device 91L may be a semiconductor package including a first semiconductor chip 3600L which is mounted on a first package substrate 95L. The first package substrate 95L may include a second sliding interconnection structure 3300AL disposed on a first surface 3101L of a first substrate body 3100L including a dielectric layer, and a third sliding interconnection structure 3300BL disposed on a second surface 3103L of the first substrate body 3100L, as described with reference to FIGS. 5 to 7. The second sliding interconnection structure 3300AL and the third sliding interconnection structure 3300BL may be provided as conductive patterns corresponding to a circuit wiring structure of a package substrate.

Embedded wires 3300CL may be embedded in the first substrate body 3100L, and the second sliding interconnection structure 3300AL, the third sliding interconnection structure 3300BL and the embedded wires 3300CL may provide a multi-layered wiring structure. First inner connecting wires 3304L may be disposed in the first substrate body 3100L to partially or fully penetrate the first substrate body 3100L. The first inner connecting wires 3304L may be for electrically connecting the second sliding interconnection structure 3300AL to the embedded wire 3300CL, the third sliding interconnection structure 3300BL to the embedded wire 3300CL, or the second sliding interconnection structure 3300AL to the third sliding interconnection structure 3300BL.

A second dielectric layer 3200AL may be located on the second sliding interconnection structure 3300AL, and the first substrate body 3100L may be located below the second sliding interconnection structure 3300AL. Thus, the second sliding interconnection structure 3300AL may be located in a dielectric layer including the first substrate body 3100L and the second dielectric layer 3200AL. The first substrate body 3100L may act as the first dielectric layer 210 of FIG. 1 and the second dielectric layer 3200AL of FIG. 9 acts as the second dielectric layer 220 of FIG. 1. The second dielectric layer 3200AL may be patterned to leave exposed parts of the second sliding interconnection structures 3300AL. The exposed parts of second sliding interconnection structures 3300AL may act as first outer connecting portions 3305L which are connected to connecting members such as first bonding wires 3610L. The first bonding wires 3610L may electrically connect the first semiconductor chip 3600L to the first package substrate 95L. Although it is illustrated that the first bonding wires 3610L are bonded to the first outer connecting portion 3305L, the first outer connecting portion 3305L may be electrically connected to the first semiconductor chip 3600L through bumps (not illustrated) instead of the first bonding wires 3610L. A first protecting layer 3620L, including a molding layer, may be disposed to cover and protect the first semiconductor chip 3600L. The molding layer may include epoxy molding compound (EMC).

A portion of the third sliding interconnection structure 3300BL may be a second outer connecting portion 3307L that is connected to the first inner connecting wire 3304L or another device. A third dielectric layer 3200BL may be located on the third sliding interconnection structure 3300BL, and the first substrate body 3100L may be located below the third sliding interconnection structure 3300BL. The first substrate body 3100L may act as the first dielectric layer 210 of FIG. 1 and the third dielectric layer 3200BL of FIG. 9 may act as the second dielectric layer 220 of FIG. 1. The third dielectric layer 3200BL may be patterned to leave exposed the second outer connecting portion 3307L which may be electrically connected to other devices. An outer connecting member such as a solder ball may be attached to the second outer connecting portion 3307L.

The second semiconductor device 91R may be a second sub-package portion corresponding to a portion of the semiconductor package, like the first semiconductor device 91L. The second semiconductor device 91R may be a semiconductor package including a second semiconductor chip 3600R which is mounted on a second package substrate 95R. The second package substrate 95R may include a fifth sliding interconnection structure 3300AR disposed on a first surface 3101R of a second substrate body 3100R. The second substrate body 3100R may include a dielectric layer and a sixth sliding interconnection structure 3300BR disposed on a second surface 3103R of the second substrate body 3100R, as described with reference to FIGS. 5 to 7.

Embedded wires 3300CR may be embedded in the second substrate body 3100R, and the fifth sliding interconnection structure 3300AR, the sixth sliding interconnection structure 3300BR. The embedded wire 3300CR may provide a multi-layered wiring structure. Second inner connecting wires 3304R may be for electrically connecting the fifth sliding interconnection structure 3300AR to the embedded wire 3300CR, the sixth sliding interconnection structure 3300BR to the embedded wire 3300CR, or the fifth sliding interconnection structure 3300AL to the sixth sliding interconnection structure 3300BR. Second inner connecting wires 3304R may be disposed in the second substrate body 3100R to partially or fully penetrate the second substrate body 3100R.

A fourth dielectric layer 3200AR may be located on the fifth sliding interconnection structure 3300AR, and the second substrate body 3100R may be located below the fifth sliding interconnection structure 3300AR. Thus, the fifth sliding interconnection structure 3300AR may be located in a dielectric layer including the second substrate body 3100R and the fourth dielectric layer 3200AR. The second substrate body 3100R may act as the first dielectric layer 210 of FIG. 1 and the fourth dielectric layer 3200AR of FIG. 9 may act as the first dielectric layer 220 of FIG. 1. The fourth dielectric layer 3200AR may be patterned leave to exposed a portion of the fifth sliding interconnection structure 3300AR, and the exposed portions of the fifth sliding interconnection structure 3300AR act as third outer connecting portions 3305R which are connected to connecting members such as second bonding wires 3610R that electrically connect the second semiconductor chip 3600R to the second package substrate 95R. Although it is illustrated that the second bonding wires 3610R are bonded to the third outer connecting portions 3305R, the third outer connecting portions 3305R may be electrically connected to the second semiconductor chip 3600R through bumps (not illustrated) instead of the second bonding wires 3610R. A second protecting layer 3620R including a molding layer may be disposed to cover and protect the second semiconductor chip 3600R.

A portion of the sixth sliding interconnection structure 3300BR may be a fourth outer connecting portion 3307R that is connected to the second inner connecting wire 3304R or other devices. A fifth dielectric layer 3200BR may be located on the sixth sliding interconnection structure 3300BR. The second substrate body 3100R may be located below the sixth sliding interconnection structure 3300BR. The second substrate body 3100R may act as the first dielectric layer 210 of FIG. 1, and the fifth dielectric layer 3200BR may act as the second dielectric layer 220 of FIG. 1. The fifth dielectric layer 3200BR may be patterned to leave exposed the fourth outer connecting portions 3307R which may be electrically connected to other devices. Outer connecting members such as solder balls may be attached to the fourth outer connecting portions 3307R.

Even if the flexible connector 93 is bent or warped, a stress applied to the first sliding interconnection structures 3300T may be relieved as described above with reference to FIG. 4. Thus, the first sliding interconnection structures 3300T may possibly not be damaged or broken even when the flexible connector 93 is bent or warped.

Figure 11:
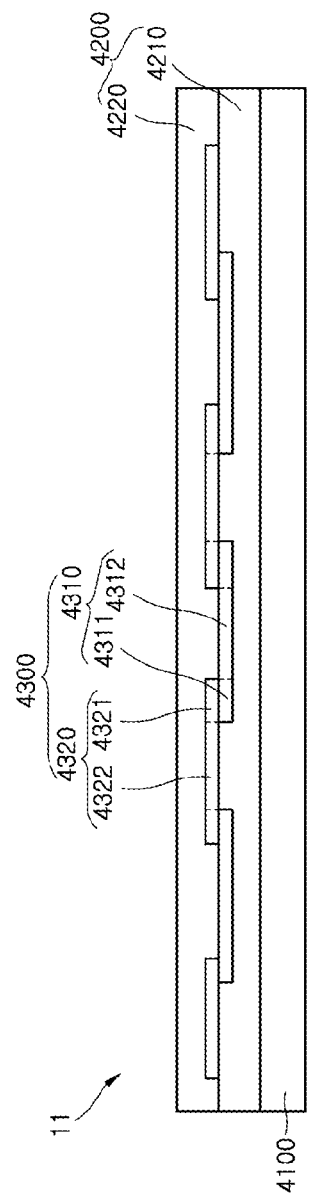
FIG. 11 is a cross-sectional view illustrating a flexible device including a sliding interconnection structure according to yet still another embodiment.

FIG. 11 is a cross-sectional view illustrating a flexible device 11 including sliding interconnection structures 4300 according to an embodiment.

Referring to FIG. 11, the flexible device 11 may include the sliding interconnection structures 4300 embedded in a dielectric layer 4200 disposed on a substrate 4100. The sliding interconnection structures 4300 may include first conductive patterns 4310 and second conductive patterns 4320 which are alternately arrayed to overlap with each other. Each of the first conductive patterns 4310 may include a first sliding contact portion 4311 and a first extension portion 4312 extending from the first sliding contact portion 4311. The second conductive pattern 4320 also may include a second sliding contact portion 4321 and a second extension portion 4322 extending from the second sliding contact portion 4321. The first conductive patterns 4310 and the second conductive patterns 4320 may be alternately and repeatedly arrayed in the dielectric layer and may be electrically connected to each other to provide one conductive line. The conductive line may be used as a part of a wiring circuit.

A first dielectric layer 4210 may be located below the sliding interconnection structures 4300 and a second dielectric layer 4220 may be located on the sliding interconnection structures 4300. Accordingly, a force pressing the first sliding contact portions 4311 of the first conductive patterns 4310 toward the second sliding contact portions 4321 of the second conductive patterns 4320 may be generated by the dielectric layer 4200 including the first and second dielectric layers 4210 and 4220.

Figure 12:
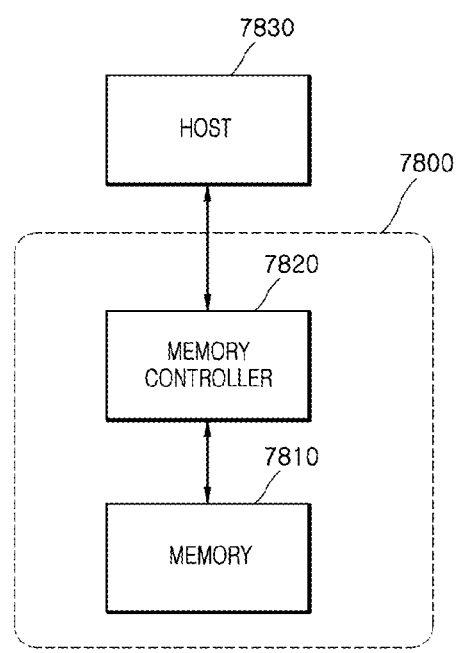
FIG. 12 is a block diagram illustrating an electronic system employing a memory card including a package in accordance with an embodiment.

FIG. 12 is a block diagram illustrating an electronic system employing a memory card 7800 including at least one semiconductor package as described in relation to FIGS. 1 through 11 in accordance with an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
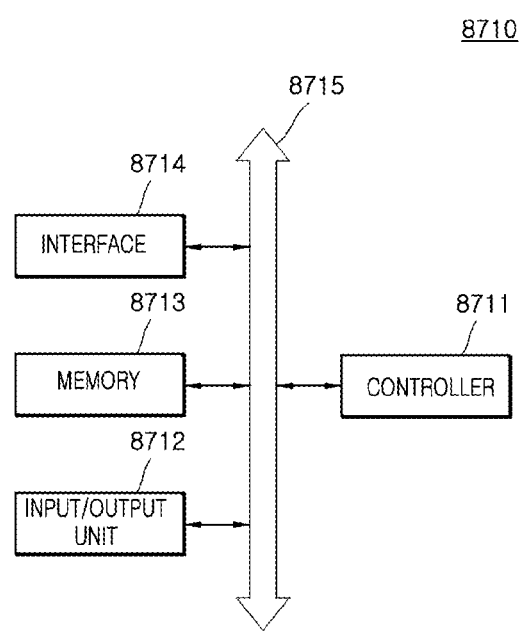
FIG. 13 is a block diagram illustrating an electronic system including a package in accordance with an embodiment.

FIG. 13 is a block diagram illustrating an electronic system 8710 including at least one semiconductor package as described in relation to FIGS. 1 through 11 in accordance with an embodiment. The electronic system 8710 may include a controller 8711, an input/output device 8712, a memory 8713, and an interface 8714. The controller 8711, the input/output device 8712 and the memory 8713 may be coupled with one another through a bus 8715 providing a path through which data moves.

In an embodiment, the controller 8711 may include one or more microprocessors, digital signal processors, microcontrollers, and/or logic devices capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communications, the electronic system 8710 may be used in a communication system such as of CDMA (code division multiple access), GSM (global system for mobile communications), NADC (North American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A flexible device comprising:
a first conductive pattern including a first sliding contact portion and a first extension portion;
a second conductive pattern including a second sliding contact portion overlapping with the first sliding contact portion and the second conductive pattern includes a second extension portion, the second sliding contact portion being in contact with the first sliding contact portion and being movable on the first sliding contact portion for a sliding motion; and
a dielectric layer in which the first and second conductive patterns are embedded,
wherein the dielectric layer comprises:
a first dielectric layer disposed on the first conductive pattern; and
a second dielectric layer disposed on the second conductive pattern, and
wherein the first dielectric layer directly contacts the second dielectric layer.

2. The flexible device of claim 1, further comprising a semiconductor substrate supporting the dielectric layer.

3. The flexible device of claim 1, further comprising a body of a package substrate supporting the dielectric layer.

4. The flexible device of claim 1, wherein each of the first and second conductive patterns include a metal pattern.

5. The flexible device of claim 1, wherein the first and second conductive patterns are alternately and repeatedly arrayed in the dielectric layer.

6. The flexible device of claim 1, wherein the first sliding contact portion is not fixed to the second sliding contact portion.

7. The flexible device of claim 1, wherein the first sliding contact portion branches from the first extension portion into a plurality of branches to provide a comb-shaped pattern.

8. The flexible device of claim 1,
wherein the dielectric layer includes an elastic material; and
wherein the elastic material includes any one selected from the group consisting of polymer, silicone rubber and silicone resin.

9. A flexible device comprising:
a package substrate including a dielectric layer directly contacting a first surface of a substrate body, a first sliding interconnection structure disposed between the dielectric layer and the first surface of the substrate body to have a first conductive pattern and a second conductive pattern, and a second sliding interconnection structure disposed on a second surface of the substrate body opposite to the dielectric layer; and
a chip mounted on the package substrate and electrically connected to the first sliding interconnection structure,
wherein the first conductive pattern has a first sliding contact portion and a first extension portion,
wherein the second conductive pattern has a second sliding contact portion overlapping with the first sliding contact portion and the second conductive pattern includes a second extension portion, and
wherein the second sliding contact portion is in contact with the first sliding contact portion and is movable on the first sliding contact portion for a sliding motion.

10. The flexible device of claim 9, wherein the first sliding contact portion is not fixed to the second sliding contact portion.

11. The flexible device of claim 9, wherein the first sliding contact portion branches from the first extension portion into a plurality of branches to provide a comb-shaped pattern.

12. The flexible device of claim 9,
wherein the dielectric layer includes an elastic material; and
wherein the elastic material includes any one selected from the group consisting of polymer, silicone rubber and silicone resin.

13. The flexible device of claim 9,
wherein the second sliding interconnection structure includes a third conductive pattern and a fourth conductive pattern;
wherein the third conductive pattern has a third sliding contact portion and a third extension portion, and the fourth conductive pattern has a fourth sliding contact portion overlapping with the third sliding contact portion and a fourth extension portion; and
wherein the fourth sliding contact portion is in contact with the third sliding contact portion and is movable on the third sliding contact portion for a sliding motion.

14. The flexible device of claim 9, wherein the substrate body comprises;
an inner connecting wire electrically connected to one of the first sliding interconnection structure and the second sliding interconnection structure; and
an embedded wire electrically connected to the inner connecting wire and embedded in the substrate body.

\* \* \* \* \*